United States Patent
Atamert et al.

(10) Patent No.: US 10,799,954 B2
(45) Date of Patent: Oct. 13, 2020

(54) METHOD FOR MANUFACTURING CONTINUOUS WIRE

(71) Applicant: EPOCH WIRES LIMITED, Foxton (GB)

(72) Inventors: Serdar Atamert, Sawston (GB); Mehmet Kutukcu, Istanbul (TR)

(73) Assignee: Epoch Wires Limited (GB)

( * ) Notice: Subject to any disclaimer, the term of this patent is extended or adjusted under 35 U.S.C. 154(b) by 267 days.

(21) Appl. No.: 15/768,165

(22) PCT Filed: Oct. 5, 2016

(86) PCT No.: PCT/GB2016/053088
§ 371 (c)(1),
(2) Date: Apr. 13, 2018

(87) PCT Pub. No.: WO2017/064471
PCT Pub. Date: Apr. 20, 2017

(65) Prior Publication Data
US 2018/0304372 A1    Oct. 25, 2018

(30) Foreign Application Priority Data
Oct. 15, 2015   (GB) .................................. 1518266.0

(51) Int. Cl.
*H01L 39/24* (2006.01)
*B22F 5/12* (2006.01)
(Continued)

(52) U.S. Cl.
CPC ............ *B22F 5/12* (2013.01); *B21C 23/08* (2013.01); *B22F 1/0074* (2013.01); *C22C 29/14* (2013.01);
(Continued)

(58) Field of Classification Search
CPC ....... B22F 5/12; B21C 23/08; H01L 39/2487; H01L 39/141; H01B 12/04; Y10T 29/49014
(Continued)

(56) References Cited

U.S. PATENT DOCUMENTS 5,830,828 A * 11/1998 Kroeger ............... H01L 39/248
505/430
6,687,975 B2 * 2/2004 Tomsic ............... H01L 39/2487
29/599
(Continued)

FOREIGN PATENT DOCUMENTS

WO    WO 2014/135893    9/2014

OTHER PUBLICATIONS

Search Report & Written Opinion issued in App. No. PCT/GB2016/053088 (dated 2016).

*Primary Examiner* — Donghai D Nguyen
(74) *Attorney, Agent, or Firm* — Barnes & Thornburg LLP

(57) ABSTRACT

There is provided a method of manufacturing a continuous wire comprising forming a strip formed from at least one metallic material into a channel, placing at least one powder into the channel and sealing edges of the channel together to produce a wire, wherein the method further comprises mixing the powder with a carrier liquid to create a slurry and placing the slurry into the channel. The carrier liquid is chemically inert with respect to the at least one powder.

18 Claims, 1 Drawing Sheet

(51) Int. Cl.
  *B22F 1/00* (2006.01)
  *C22C 29/14* (2006.01)
  *H01L 39/14* (2006.01)
  *B21C 23/08* (2006.01)
  *H01B 12/04* (2006.01)

(52) U.S. Cl.
  CPC ........... *H01B 12/04* (2013.01); *H01L 39/141* (2013.01); *H01L 39/2487* (2013.01); *B22F 2301/058* (2013.01); *B22F 2302/05* (2013.01); *B22F 2998/10* (2013.01); *Y10T 29/49014* (2015.01)

(58) Field of Classification Search
  USPC .......................................................... 29/599
  See application file for complete search history.

(56) References Cited

U.S. PATENT DOCUMENTS

2002/0198109 A1 12/2002 Wu
2009/0258787 A1 10/2009 Wilkie et al.
2012/0004110 A1 1/2012 Takahashi et al.

\* cited by examiner

METHOD FOR MANUFACTURING CONTINUOUS WIRE

CROSS REFERENCE TO RELATED APPLICATIONS

This application is a U.S. nationalization under 35 U.S.C. § 371 of International Application No. PCT/GB2016/053088, filed Oct. 5, 2016, which claims priority to United Kingdom Patent Application No. 1518266.0, filed Oct. 15, 2015. The disclosures set forth in the referenced applications are incorporated herein by reference in their entireties.

FIELD OF THE INVENTION

This invention relates to a method of manufacturing continuously produced wire, in particular superconductive wires.

BACKGROUND TO THE INVENTION

Superconductive $MgB_2$ continuous conductors created using powder-in-tube (PIT) conductor technology are of particular use in applications working at temperatures in the range 15-20K. This includes MRI applications, high energy demanding applications operating as DC cables in datacenters, steel and aluminium refining, hybrid energy storage applications and as electromagnets in wind generators. A need for large quantities of superconducting conductors for a variety of applications puts pressure on the manufacturing capabilities of the traditional powder-in-tube (PIT) batch technology of composite wires.

In the most common PIT technique, the precursor powder is packed in one or more metal tubes, these tubes are then drawn, swaged or drawn into wires or tapes, and this followed by heat treatment in a vacuum, air or in an inert atmosphere. PIT wires can be classified into two main approaches depending upon the starting material. The first is the so-called in situ route that uses unreacted starting powders Mg and B. The second is the ex situ route that employs $MgB_2$ powder as the starting material.

Existing technologies are based on batch processes which inherently produce limited lengths of wire which are undesirable for large scale applications where superconducting joints on the winding would produce unacceptable mechanical thermal and electromagnetic constraints of the system. In order to produce large coils or long cables from PIT $MgB_2$ wires, many discrete lengths of wire would have to be spliced together in order to produce a wire of sufficient length. Each joint would increase the risk of a loss in superconductivity, making this an unacceptable process for the superconductivity industry.

There is currently no technology available to manufacture continuous $MgB_2$ superconductive wire in lengths required by large scale applications such as magnets for MRI. A continuous wire production relies on uninterrupted feeding of Mg, B or $MgB_2$ powders with or without any further additions such as dopants to a 'U' shaped profile homogenously. WO2014/135893 discloses a process in which continuously fed strip is first converted to a 'U' shape, which is subsequently filled with powder feeders before being closed as a wire and sealed by laser seam welding. This process and other similar processes require feeders which should be capable of feeding nano or micron sized powders uniformly and precisely to a relatively narrow 'U' profile.

Mixing and feeding of predetermined quantities of homogeneous fine powder (below 10 microns, more specifically below 1 microns) creates many problems including, but not limited to moisture absorption, electrostatic charging, and powder compaction. The atmosphere mainly affects moisture absorption and electrostatic charging. Electrostatic charging is also affected by mechanical design. Powder compaction problem is mainly a characteristic problem of certain powders, which is also mainly affected by mechanical design.

Furthermore, if the powder has burning or explosive character then inerting the system atmosphere is, most of the time, only safe solution for mixing and feeding. The simplest way of inerting is to introduce inert (noncombustible) gases in such a way that there is never a mixture with a combustible concentration. Ignition energy is a very important characteristic for prevention of explosions. Several kinds of powders have very low minimum ignition energies including magnesium powder. Inerting solves the moisture absorption problem but does not solve the electrostatic charging and powder compaction.

SUMMARY OF THE INVENTION

In accordance with a first aspect of the invention, there is provided a method of manufacturing wires comprising forming a strip formed from at least one metallic material into a channel, placing at least one powder into the channel and sealing edges of the channel together to produce a wire, wherein the method further comprises, mixing the powder with a carrier liquid to create a slurry and placing the slurry into the channel.

The carrier liquid is chemically inert with respect to the at least one powder.

A plurality of powders may be mixed individually with the carrier liquid to create a plurality of slurries and then the plurality of slurries combined to create one combined slurry. Alternatively the powders may all be mixed within one slurry from the outset.

The method may further comprise heating after the slurry has been placed in the channel so as to leave a solid residue within the channel.

The liquid carrier is preferably one of a liquid hydrocarbon or one of ethyl alcohol, acetone, methyl acetate, or ethyl-acetate.

The at least one powder is desirably capable of forming a superconductive material and so the wire is a superconductive wire.

The at least one metallic material is preferably one of Ni, or Co, or Nb, or Ti, or Fe, or alloys of these materials, or stainless steels, or Mg, or Cu bronze or Monel.

The strip may be formed from at least two metallic materials having different electrical conductivities and/or be formed from multilayers of metallic materials.

Preferably at least two different powders are placed in the channel.

The powder may comprise one or more of B, Mg, $MgB_2$, NbTi, Nb—Al, NbZr, Nb—Sn, Nd, Fe, As(OF), Mg with B, or Nb with Ti or Nb with Zr, Nb with Al or Nb with Sn. In-situ constituents are components that are unreacted and so are individual elements or compounds that will react with each other upon heat treatment; ex-situ constituents are reacted components such as compounds which further react upon heat treatment.

In a particularly preferred embodiment, the in-situ constituents will be Mg with B, and the ex-situ constituents will be $MgB_2$.

The powder or powders may contain doping additions such as nitrides, borides, silicides, carbon or carbon inorganics, metal oxides, metallic elements or organic compounds.

The channel may be formed into a U-shaped profile.

The method may further comprise sealing the edges of the channel by welding in an inert atmosphere to create a sealed wire.

If desired, the sealed wire may be further processed by rolling to smaller diameters.

The sealed wire may be heat treated.

Preferably the method is a continuous process as part of an in-line production line.

The wire may be drawn, extruded, swaged, rolled or deformed to smaller size by mechanical deformation to produce smaller diameter wire.

The wire may be thermomechanically treated to react the powder or powders.

In accordance with a second aspect, the invention also lies in a wire made using the method as aforesaid.

The invention will now be described by way of example with reference to the accompanying drawings in which.

DESCRIPTION

It should be noted that the present invention is not limited to the examples and sketches described herein, and various combinations and modifications can be implemented without changing the purpose of the invention.

Figure 1:
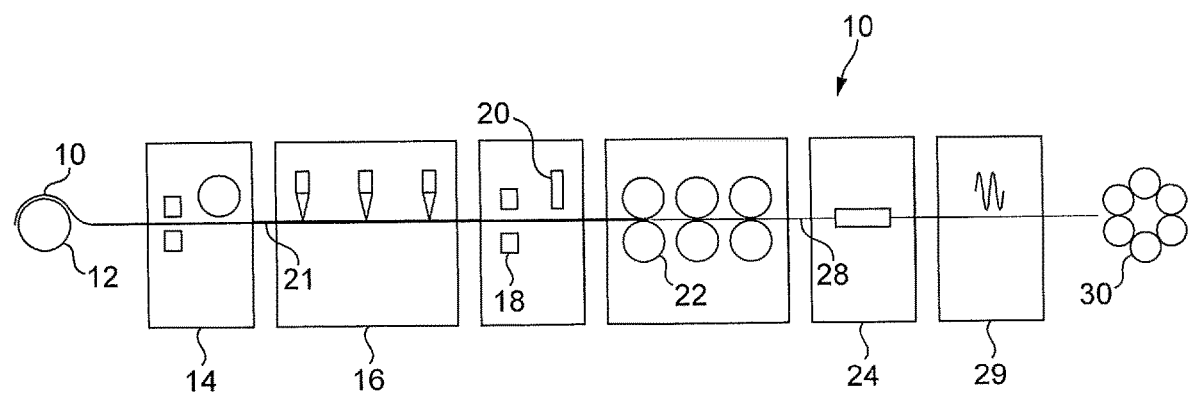
FIG. 1 shows a schematic representation of a wire production line.

FIG. 1 is a schematic illustration of a continuous seamless superconductive wire production line 10 in accordance with the invention. Bimetallic strip 10 formed from a sheet of Copper conjoined with a sheet of Steel is fed continuously from strip dispenser 12 to edge profiling unit 14 where strip 10 is formed into a U-shaped profile. At stage 16, a U-shaped channel 21 formed by the cavity of the 'U' profile is filled with particles of amorphous powder contained in a liquid slurry and the slurry dried, as will be described in more detail with reference to FIG. 2.

The U-shaped channel is then closed by closing rollers 18 and seam welded along its length in an inert argon atmosphere using in-line welding equipment 20 to form a perfectly closed seam. The sealed and filled strip is then rolled to smaller diameters using rollers 22 to create wire 28, typically to produce wire between 10 to 5 mm wide and 0.8 to 2.5 mm thick. Wire 28 then undergoes in-line heat treatment 24 in a protective atmosphere to make sure that the fusion and chemical reactions of all constituents are complete or to soften the metallic material allowing further size reduction to take place. Optionally eddy current measurements 29 can be undertaken to quantify the wire characteristics and ensure quality control. The superconductive wire 28 is then stored on a cable assembly 30.

Figure 2:
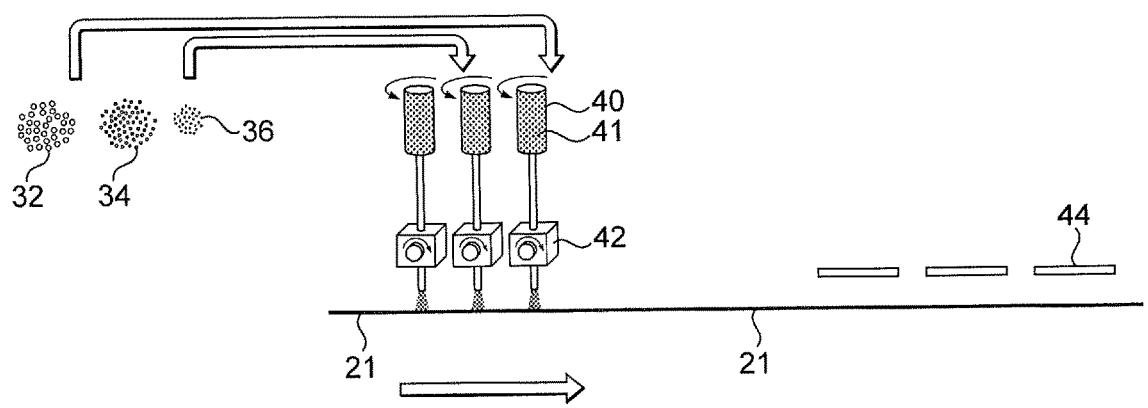
FIG. 2 shows a schematic representation of a filling stage forming part of the production line.

FIG. 2 shows the steps within filling stage 16. The constituents required for superconductive wire 28 are typically Mg 32, B 34 and $MgB_2$ 36 together with optional dopants so as to create a superconductive $MgB_2$ wire. Other powder constituents can be used depending on the type of wire required so as to produce, for example, low temperature superconductors such as Nb-based intermetallics, NbTi, high-temperature perovskite superconductors, iron based superconductors such as NdFeAs(OF), and other superconducting materials which can be manufactured by Powder-in-tube technique. Doping compounds can be nitrides, borides, silicides, carbon or carbon inorganics, metal oxides, metallic elements or organic compounds. Boron and magnesium powders have particle sizes of below 10 microns (most of the powder is below 1 microns) and 150 microns, respectively. Particle size distribution of superconductive powders could vary from few nanometres to tens of microns.

The process starts with transforming continuously fed flat bimetallic strip to a 'U' profile followed by an unique powder feeding technology allowing micron sized Mg and Cu powders, typically 300-50 microns in diameter, as well as nano sized B and dopant powders to be fed continuously to a 'U' shaped material. Laser seam welding technology is applied to seal the conductor seam allowing continuous wire production.

Powders with different particle size distribution, different particle shape and densities are difficult to mix homogenously. In addition, flowability of fine powders become very poor as their particle size gets smaller and they can easily get clogged.

It is important to ensure continuity of the same quality of $MgB_2$ powder (purity, crystallinity, density, thickness) inside the wire.

In FIG. 2, the constituent powders 32, 34, 36 required to form wire 28 are mixed in a low temperature boiling point liquid in containers 40, with the liquid not oxidizing to any of the powders. The liquid can be, but not limited to, methyl, ethyl of isopropyl alcohol. Other suitable liquids include acetone, methyl acetate, ethyl-acetate and other hydrocarbons. The constituent powders can be mixed together in one container or in separate containers so that they are only combined once suspended within the liquid.

The fine powders such as Mg, B, $MgB_2$, doping additives as well as other metallic and non-metallic constituents are transferred to containers 40 either in a mixed state or individually. Powders are mixed in a liquid medium 41 such as ethyl alcohol, which is chemically inert to all of the powder constituents even at its boiling point. Depending on the powder composition, acetone, methyl acetate, ethyl-acetate, alcohols or other liquid hydrocarbons can be used to prepare the slurry mix.

The powders are mixed until they are homogeneously distributed in an ethyl alcohol flowing one phase slurry. Powder mixture can be fed into ethyl alcohol up to 58% solid content ratio. After this ratio it gets harder to mix the powders as one phase.

By mixing the powders into an inert carrier liquid, problems with oxidation, moisture absorption and so on are avoided and the powders are mixed to a better homogeneity level. Oxidation, moisture, electrostatic charge and compression of the powders are not a problem.

The slurry mixing containers 40 are designed to continuously mix the slurry in a manner that fine powders are uniformly dispersed within the slurry mix without creating any segregation or preferential separation. This ensures consistent, segregation free at a high precision rate to relatively small 'U' shaped profiles. Feeding tubes 39 are connected to slurry pumps or feeders such as peristaltic, progressive cavity and rotary pumps to pump mixed slurry through feeding tubes 39 into the 'U' shaped profile 21 through feed nozzles.

Using a standard pump 42, the slurry is then fed into the moving U-shaped strip. Strip feeder can easily communicate with the pump and adjust the system speed. The solvent within the "U" profile 21 needs to be removed prior to laser seam-welding and so the filled strip is dried down to any moisture level using in-line heaters 44 which can be tube furnaces, ceramic heaters, infra-red heaters, or induction heaters. The evaporated solvent is removed either by blowing hot air or hot gas or extracted using a vacuum pump.

The mix remaining within the profile then becomes ready for seam-welding.

The powder after drying is denser than the prior art powder mixture prepared and fed with standard mixing and feeding techniques. The denser mixture not only improves the conductivity properties but also prevents any powder movement caused by air flow created due to temperature dependent air expansion during laser welding. This invention can be used for any type of fine powders or fine powder mixtures fed into a wire.

The method of using an inert slurry can be used in the production of any powder-containing wire, such as used in welding, arc spraying and bimetal-sheathed insulated wires.

Thus superconductive wires using the powder-in-tube process can be manufactured using a continuous automated seam welding process based on the use of bimetallic clad strip and a slurry feeding system.

The invention claimed is:

1. A method of manufacturing wires comprising a strip formed from at least one metallic material into a channel, placing at least two different powders into the channel and sealing edges of the channel together to produce a wire, wherein the method further comprises mixing the at least two different powders with a carrier liquid chemically inert with respect to the at least two different powders to create a slurry, placing the slurry into the channel and heating after the slurry has been placed in the channel so as to leave a solid residue within the channel before laser-seam welding.

2. The method of manufacturing wires according to claim 1, comprising mixing a plurality of powders individually with the carrier liquid to create a plurality of slurries and then combining the plurality of slurries to create one combined slurry.

3. The method of manufacturing wires according to claim 1, wherein the liquid carrier is one of a liquid hydrocarbon or one of ethyl alcohol, acetone, methyl acetate, or ethylacetate.

4. The method of manufacturing wires according to claim 1, wherein the at least two different powders are capable of forming a superconductive material.

5. The method of manufacturing wires according to claim 1, wherein the at least one metallic material is one of Ni, or Co, or Nb, or Ti, or Fe, or alloys of these materials, or stainless steels, or Mg, or Cu bronze or Monel.

6. The method of manufacturing wires according to claim 1, wherein the strip is formed from at least two metallic materials having different electrical conductivities.

7. The method of manufacturing wires according to claim 1, wherein the strip is formed from multilayers of metallic materials.

8. The method of manufacturing wires according to claim 1, wherein the wire is a superconductive wire.

9. The method of manufacturing wires according to claim 1, wherein the at least two different powders comprise one or more of B, Mg, MgB2, NbTi, Nb—Sn, NbZr, Nb—Al, Nd, Fe, As(OF), Mg with B, or Nb with Ti or Nb with Zr, Nb with Al or Nb with Sn.

10. The method of manufacturing wires according to claim 1, wherein a first powder is MgB2 and a second powder is a mixture of Mg and B.

11. The method of manufacturing wires according to claim 1, wherein the powders contain doping additions such as nitrides, borides, silicides, carbon or carbon inorganics, metal oxides, metallic elements or organic compounds.

12. The method of manufacturing wires according to claim 1, wherein the channel is formed into a U-shaped profile.

13. The method of manufacturing wires according to claim 1, wherein the edges of the channel are sealed by welding in an inert atmosphere to create a sealed wire.

14. The method of manufacturing wires according to claim 13, wherein the sealed wire is further processed by rolling to smaller diameters.

15. The method of manufacturing wires according to claim 13 wherein the sealed wire is heat treated.

16. The method of manufacturing wires according to claim 1, wherein the method is a continuous process.

17. The method of manufacturing wires according to claim 1, wherein the wire is drawn, extruded, swaged, rolled or deformed to smaller size by mechanical deformation to produce smaller diameter wire.

18. The method of manufacturing wires according to claim 1, wherein the wire is thermomechanically treated to react the powder or powders.

* * * * *